United States Patent [19]

Eichelberger et al.

[11] 4,145,748

[45] Mar. 20, 1979

[54] SELF-OPTIMIZING TOUCH PAD SENSOR CIRCUIT

[75] Inventors: Charles W. Eichelberger, Schenectady; Walter J. Butler, Scotia, both of N.Y.

[73] Assignee: General Electric Company, Schenectady, N.Y.

[21] Appl. No.: 863,875

[22] Filed: Dec. 23, 1977

[51] Int. Cl.² .......................... G06G 7/12; G06F 7/02
[52] U.S. Cl. ............................. 364/862; 235/92 CA; 307/125; 324/60 C; 340/146.2; 340/365 C
[58] Field of Search ....................... 364/862, 200, 900; 200/5 A; 340/146.2, 365 C, 347 AD; 307/116, 125; 324/60 C, 60 CD; 357/24; 235/92 EV, 92 CA

[56] References Cited

U.S. PATENT DOCUMENTS

| | | | |
|---|---|---|---|
| 3,601,809 | 8/1971 | Gray et al. | 364/200 |
| 3,696,409 | 10/1972 | Braaten | 340/365 C |
| 3,879,711 | 4/1975 | Boaron | 364/200 |
| 3,930,142 | 12/1975 | Meier | 235/92 EV |
| 3,931,610 | 1/1976 | Marin et al. | 324/60 CD |
| 3,974,472 | 8/1976 | Gould, Jr. | 307/116 |
| 4,001,536 | 1/1977 | Eberhardt, Jr. | 340/365 C |
| 4,039,940 | 8/1977 | Butler et al. | 324/60 C |
| 4,053,789 | 10/1977 | Schultz | 307/116 |
| 4,055,735 | 10/1977 | Eachus et al. | 200/5 A |

Primary Examiner—Malcolm A. Morrison
Assistant Examiner—Errol A. Krass
Attorney, Agent, or Firm—Geoffrey H. Krauss; Joseph T. Cohen; Marvin Snyder

[57] ABSTRACT

A plurality of capacitive touch pad sensors are multiplexed to the input of a common charge transfer analog-to-digital converter (CTAD) under the control of a control logic circuit. The no-touch digital output of each touch pad is stored in a memory. The touch pads are then sequentially addressed and their output level is digitized in the CTAD and the digital output of each touch pad is compared to its no-touch value stored in the memory. If the digital value read is sufficiently different from the no-touch memorized value, a touch-detection signal is given. The no-touch digital reading in the memory is periodically updated, by a count of only one at most, if the updated no-touch value differs from the no-touch value in the memory.

9 Claims, 10 Drawing Figures

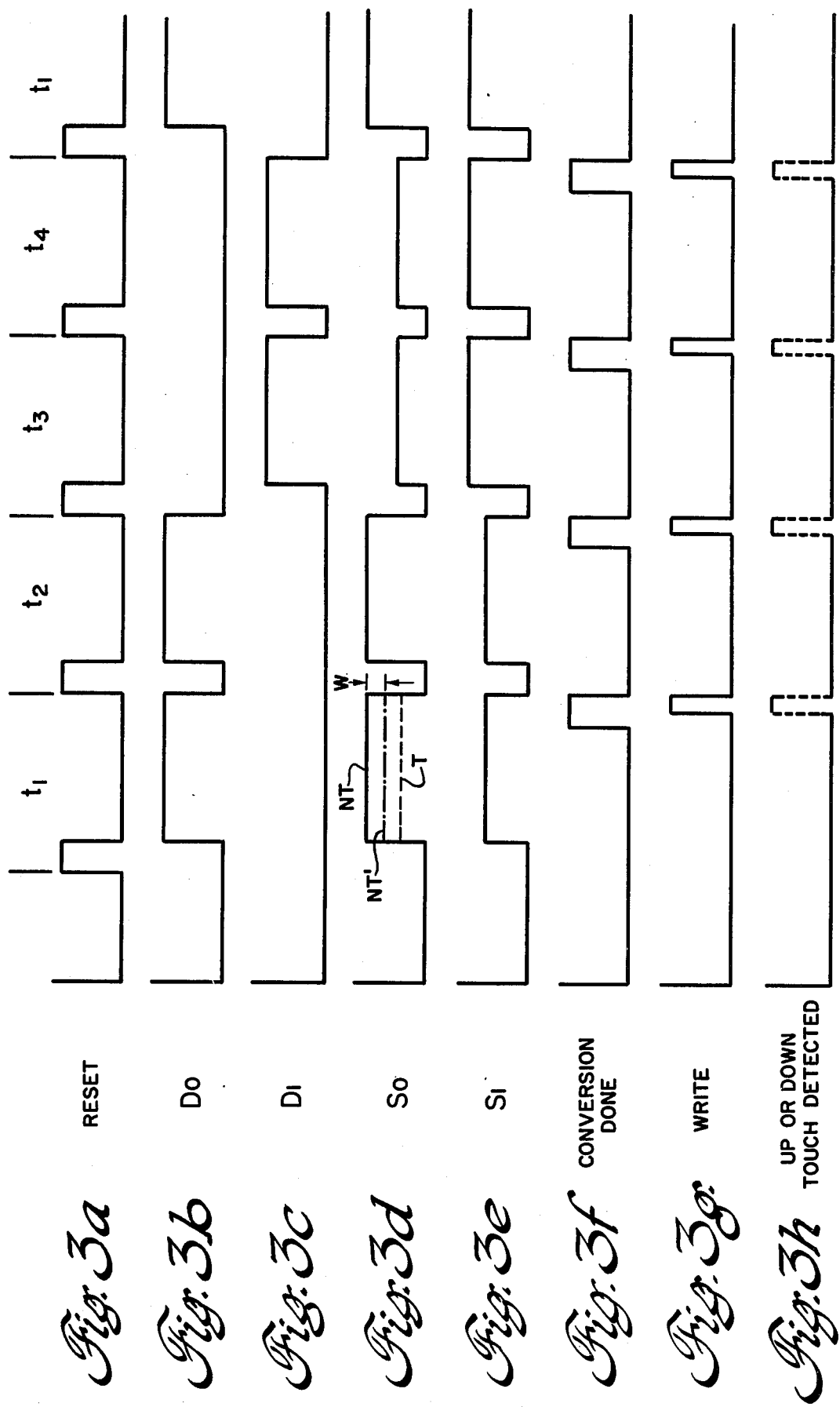

SELF-OPTIMIZING TOUCH PAD SENSOR CIRCUIT

BACKGROUND OF THE INVENTION

This invention relates to a touch pad sensor circuit, and more specifically relates to a novel arrangement for multiplexing the readout of a plurality of capacitive touch pads using digital techniques.

Capacitive touch sensors are a well known means for providing inputs to various devices including home appliances such as kitchen ranges which have touch pad devices arranged in a keyboard style array. The capacitive touch sensor is useful in this application since it isolates the user from system control circuits and voltages.

A typical capacitive touch sensor of the prior art includes a high voltage pulse generating device coupled to a capacitive touch plate which is, in turn, coupled to a receiver circuit. The touch plate is one electrode of a capacitor, isolated by a dielectric such as a glass plate. When the user touches the glass plate, the capacitance value of the touch plate capacitor is changed since the capacitance to ground of the one electrode of the device is changed by the presence of the user. This capacitance change is small, but it will attenuate the pulse signal transferred by the capacitor from the pulse generator circuit to the receiver circuit. However, to provide reliable detection of the touch of the plate by a user, relatively high voltages should be generated by the pulse source, and sensitive detection circuits are needed which have stable, long-term operating characteristics.

A digital capacitance measuring circuit for digitizing the output of a capacitive touch plate is described in our U.S. Pat. No. 4,039,940, dated Aug. 2, 1977, entitled CAPACITANCE SENSOR, and assigned to the assignee of the present invention. In this patent, a charge transfer analog-to-digital converter (hereafter CTAD) circuit is shown which produces a digital output from the touch pad detector, which digital output changes from a no-touch value to a touch value in response to the touching of the sensor.

All touch pad systems to date, including the touch pad system described above in our U.S. Pat. No. 4,039,940, have been hampered by a number of interrelated problems. Thus, the multiplexing limit of presently known touch pad systems is approximately two touch pads per sensor. In order to exceed two touch pads per sensor, extremely high drive voltages on the order of 100 to 200 volts, for example, are required. Moreover, parasitic capacitive coupling between different drivers and the same sensor will cause differences in the voltage sensed for the different drivers for either touch or no-touch conditions.

Another of the problems is that in order to reliably sense the touch or no-touch condition, only about two drive lines can be associated with any given sensor. As many as three drive lines may be used for a given sensor but extreme care would be needed to balance the received signals from various drivers. This extreme care extends to touch pad layout and places undue layout restrictions on the placement and size of the touch pads.

A further problem is that in systems where there are a large number of touch pads, the necessity for having different threshold values for each sensor increases the system cost and requires a large number of trimming operations.

Variations in the characteristics of the individual touch pad panels have produced additional problems where these variations may be caused because of differences in the thickness of the glass and in the dielectric constant of the glass of the different touch pads. Variations of only a few percent between touch pads can cause significant difficulty in making the touch or no-touch decision.

A further source of variability is the aging of the touch pads, over a long period, and in environmental effects on the touch pad, such as buildup of grease and cooking material films on the glass panel which can be expected in household appliances.

In view of the above problems, good reliability can be obtained with a multiplexing level of one but the number of sensors required would mean additional circuit chips and a tremendous number of connections to the touch pad panel.

Multiplexing levels of two to three might be used with presently available technology to obtain reliable operation but these impose significant constraints on the appearance and user function aspects of the panel design.

BRIEF DESCRIPTION OF THE PRESENT INVENTION

In accordance with the present invention, a plurality of capacitive touch pads is associated with memory and logic elements in a manner to allow a very high level of multiplexing to be obtained. The arrangement of the present invention is inherently tolerant to variations in the actual touch pad circuitry and in the touch pad driver circuitry, and permits a minimum number of connections between the touch pad panel and the touch pad sensing electronics. The present invention also accommodates long-term drift in circuit parameter values, and permits maximum latitude to the system designer in the placement and configuration of the touch pad.

In accordance with the invention, an analog-to-digital (A/D) converter, preferably a CTAD, is provided to convert voltages associated with each of the touch pads into digital values. The CTAD converter may utilize a circuit identical to that disclosed in our U.S. Pat. No. 4,039,940 discussed above. The digital reading obtained for the no-touch condition for each touch pad is stored in a memory. A control logic circuit then cycles through all touch pads and compares the digital reading obtained from each of the touch pads to the value of the no-touch reading for the respective touch pad which has been stored in the memory. When a significant departure from the no-touch condition is obtained, in the proper direction, a touch indication is given for that particular touch pad and an appropriate control function is initiated through other control circuitry.

Two different circuits are provided for determining when a touch condition exists. In the first, a fixed value below the no-touch value in memory is required to indicate a touch condition. In the second arrangement, a fixed percentage of the no-touch value is defined, below which any received pulse is recognized as a touch condition.

In accordance with an important feature of the invention, the touch pad sensor circuit is made to be self-optimizing by periodically operating all touch pads in an optimizing mode which updates the no-touch digital output in the system memory. The updated reading, however, can be changed by only one count during any cycle of the optimizing mode to prevent a transient signal from causing any substantial change in the no-touch readings for any touch pad. The optimizing mode is interspersed with the normal touch or no-touch sensing mode as desired and as determined by the control logic means. Thus, the circuit becomes inherently tolerant of all variations in the touch pad circuitry and is freed for the need for any manual adjustment of trimming of the circuit.

From the above, one object of the present invention is to digitize the developed voltages associated with each of a plurality of touch pads in a touch controlled system; to store the no-touch digital value for each touch pad in a memory; and to compare the present digital reading for each touch pad with the no-touch digital reading previously stored to determine when a touch condition has occurred.

Another object of this invention is to provide a novel method for continuously updating the no-touch voltage reading in a digital memory in such a way that these readings are not significantly changed by short-term transients.

Still another object of this invention is to obtain an adjustment-free method for sensing touch pad signals, which are subject to a high level of multiplexing.

Yet another object of this invention is to provide a novel touch control system which provides the designer with great freedom of layout and manufacturing tolerance standards.

These and other objects of this invention will become apparent upon consideration of the following detailed description taken with the drawings.

BRIEF DESCRIPTION OF THE DRAWINGS

FIGS. 3a to 3h are timing diagrams for the various voltages and signals of FIGS. 1 and 2.

DETAILED DESCRIPTION OF THE INVENTION

Figure 1:
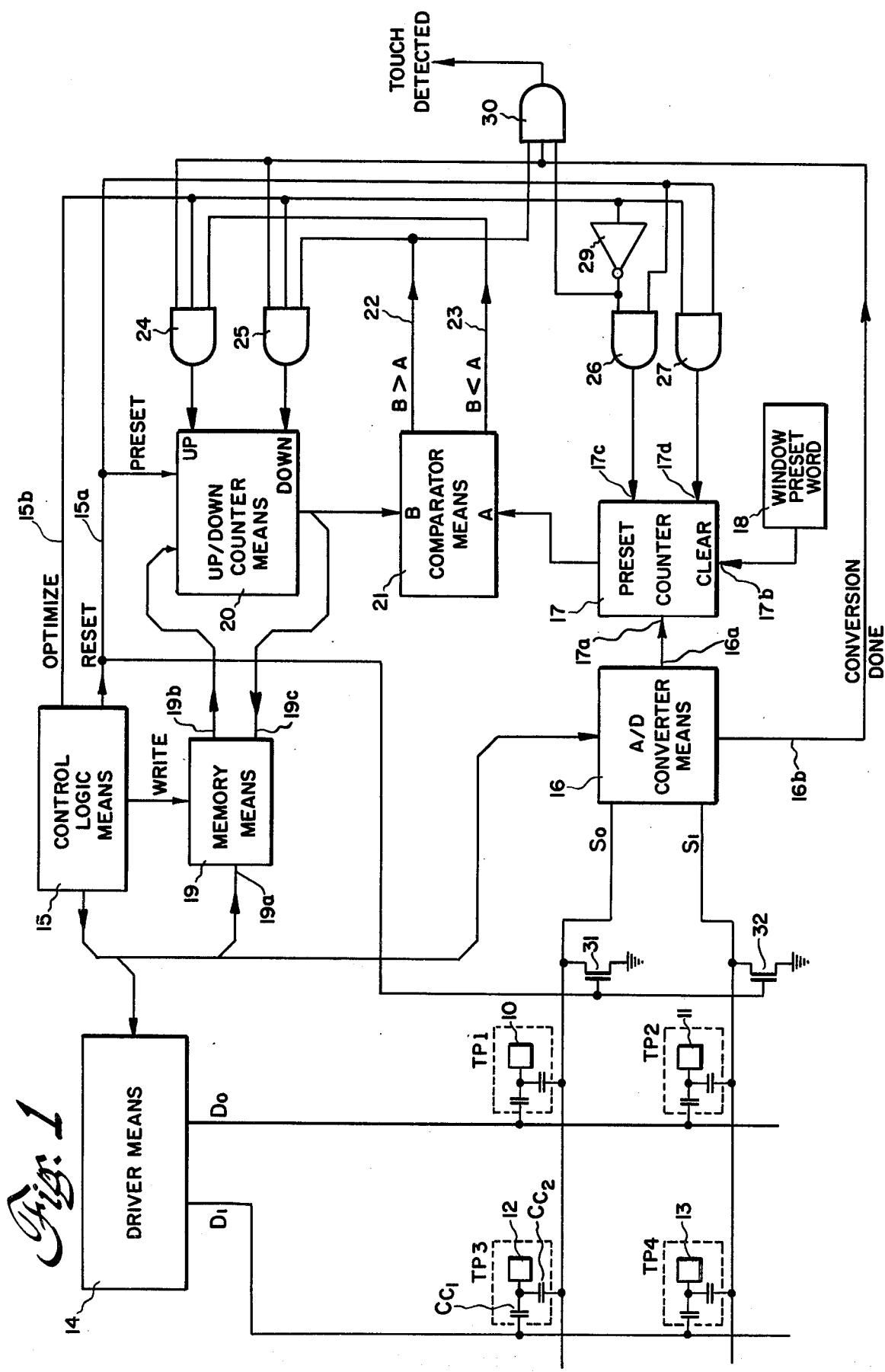
FIG. 1 is a block diagram of a first embodiment of the invention wherein a touch condition is indicated when the digital output of any of the touch pads is some fixed value below the no-touch value of the pad which was stored in the memory of the system.

Referring first to FIG. 1, there is shown in block diagrammatic form a processing circuit for processing the outputs of four touch pads TP1, TP2, TP3 and TP4. While four touch pads are shown in FIG. 1, it should be understood that any desired number of touch pads could have been shown.

Each of the touch pads of FIG. 1 consists of a flat plate, shown as flat plates 10 to 13 for touch pads TP1 to TP4, respectively, where each of the flat plates represents the common electrodes of a pair of coupling capacitors $C_{c1}$ and $C_{c2}$ (shown only for TP3, in the interests of simplicity). This common electrode of the coupling capacitors may be coupled to ground, as during a touch condition, so that the capacitance-to-ground of the touch pads changes when an operator physically touches the common electrode (or an insulator supported by the common electrode) with his finger.

Touch pads TP1 and TP2 are connected to driver line $D_0$ by the coupling capacitors $C_{c1}$, and are similarly coupled to output lines $S_0$ and $S_1$, respectively, by the coupling capacitor $C_{c2}$. Additional touch pads of an extended array could have been connected to the line $D_0$. Line $D_1$ is similarly coupled to touch pads TP3 and TP4 and these touch pads are also capacitively coupled to the output lines $S_0$ and $S_1$, respectively. Again, additional touch pads could have been coupled to the line $D_1$ and to other output lines.

Lines $D_1$ and $D_0$ are output lines of a driver means 14 which produces output voltage pulses on lines $D_1$ and $D_0$ (FIGS. 3b and 3c, respectively) which may be relatively low-voltage pulses of the order, for example, of 10 volts as directed by a control logic means 15, as will be described more fully hereinafter.

The output lines $S_0$ and $S_1$ are connected to the input of a suitable analog-to-digital converter 16. The signal on each line $S_0$ or $S_1$ (FIGS. 3d and 3e, respectively) or any other line coming into the analog-to-digital converter means, as selected by the control logic means 15, is converted from an analog value to its digital value by A/D converter 16. In a preferred embodiment of the invention, the A/D converter 16 is of the CTAD type shown in our U.S. Pat. No. 4,039,940.

The output 16a of the CTAD circuit is applied to a count input 17a of a CTAD counter 17. The A/D converter 16 also produces a "conversion done" output 16b (FIG. 3f) when it is has completed the conversion of the signal on line $S_0$ or $S_1$.

A window-preset-word input circuit 18 is also applied to a data input 17b of the counter 17 to establish a preselected, fixed count in counter 17 prior to counter 17 receiving a conversion count from A/D converter means, for a purpose hereinbelow more fully described. It should be understood that a single "window" count may be permanently wired into the window circuit (as implementing block 18 by permanent wiring at the data input of a resetable counter used for circuit 17); and that a manually or electrically selectable fixed count can be implemented by means of switches and the like at the counter data inputs in manner known to the art.

A digital memory 19 which may be a semiconductor memory or any other desired type of memory is provided to store the no-touch digital output reading of each of the touch pads TP1 to TP4 as will be described hereinafter. The memory 19 is controlled by the control logic means 15 and can read out or receive data, via output 19b or input 19c, respectively, with respect to up/down counter 20. The up/down counter 20 and the counter 17 are each connected to inputs of comparator 21 as shown. The comparator 21 has output lines 22 and 23, which, respectively, go high when the count in counter 20 exceeds or is less than the count in counter 17.

The digital processing circuit includes AND gates 24 and 25 which are connected to the up and down inputs, respectively, of the up/down counter 20 as well as AND gates 26 and 27 which are connected to the preset and clear input terminals 17c and 17d respectively of counter 17 as shown. One input of AND gate 26 includes an inverter 29 connected to the optimized output line of the control logic means 15. Finally, an AND gate 30 is provided which has an output indicating a touch condition at whichever touch pad TP1 to TP4 has been addressed by the control logic means 15 at the time the touch-detected output is produced.

The operation of FIG. 1 is now described with reference being made to the timing diagrams of FIG. 3a to 3h. As shown in FIG. 3a, the control logic means 15 produces a reset pulse at the beginning of each time interval $t_1$, $t_2$, $t_3$ and $t_4$. Each of these pulses is produced at the same time that the memory means 19 is addressed for the no-touch readings stored in the memory for one of the touch pads TP1 to TP4, respectively. Thus, during the time interval $t_1$, the no-touch reading for touch pad TP1 is being addressed and the processing of the circuit is concerned with the condition of the touch pad TP1. In a similar manner, during intervals $t_2$, $t_3$ and $t_4$, the conditions of touch pads TP2, TP3 and TP4, respectively, are involved.

Considering first the cycle involving touch pad TP1, the cycle begins with a reset pulse (FIG. 3a) at reset output 15a at the beginning of cycle $t_1$, which pulse turns on the transistors 31 and 32 to connect lines $S_0$ and $S_1$ to ground during the duration of the pulse. At the same time, the reset pulse will either clear or preset counter 17, depending upon the other inputs to gates 26 and 27 as will be disclosed more fully hereinafter. The reset pulse also fills the up/down counter 20 with the contents of the appropriate memory location of memory 19 containing the digital value of the last no-touch reading of touch pad TP1. Note that the control logic 15 will supply the proper address to the address input 19a of memory 19, corresponding to the particular touch pad being measured. Memory 19 outputs, at 19b, the stored no-touch value for the particular touch pad, for transfer to up/down counter 20.

When the reset pulse of FIG. 3a in interval $t_1$ ends, the appropriate driver line $D_0$ or $D_1$ is turned on by the control logic means 15, as shown in FIGS. 3b and 3c, respectively. Thus, when touch pad TP1 is being measured, line $D_0$ is turned on. Note that line $D_0$ is also turned on in the next period $t_2$ when touch pad TP2 is being measured. Line $D_1$ is turned on when touch pads TP3 and TP4 are being measured in time intervals $t_3$ and $t_4$, respectively.

The A/D converter 16 then measures the voltage on the appropriate sense line $S_0$ or $S_1$ (FIGS. 3d and 3e, respectively) as addressed by the control logic to correspond to the particular touch pad being measured. The counter, prior to receipt of the reading from A/D converter 16, has had a "window" count preset therein by the action of turning on the preset input 17c (via AND gate 26 whenever the RESET and OPTIMIZE outputs of control logic 15 are respectively present and not present, i.e. respectively a logic one and a logic zero in a positive logic system). The resultant reading from the A/D converter 16 is then counted in the counter 17, in addition to the preset "window" count already stored in counter 17.

When the voltage conversion in converter 16 is completed, as indicated by a conversion-done signal (FIG. 3f) which is applied to gates 24, 25 and 30, a comparison is made in the comparator 21 of the contents of counter 17 which is the measured value of (a) the touch pad output plus the preset "window" value, if any such value has been previously selected, and (b) the contents of counter 20 received from memory 19 which is the last no-touch value of the touch pad being measured. If the counter 17 count (signal A) is less than the count of counter 20 (signal B), a signal (B>A output) is applied to comparator output line 22. This output, along with the conversion done output from counter 16 and the output from inverter 29 (since there is not an "optimize" output), will trip the touch-detect gate 30 indicating that a touch condition has been detected for the touch pad under evaluation. An output from the touch-detect gate 30 during interval $t_1$ identifies that touch pad TP1 has been touched, thereby to cause the operation of some suitable control circuit (not shown). Thus, as illustrated for TP1, in FIG. 3d, the no-touch output NT has a magnitude exceeding the magnitude of the touch output T for the particular touch pad then being interrogated. The difference between the no-touch and touch outputs (i.e. NT count - T count) must be established at some non-zero value, taking into account variations of the signal on the output line (e.g. $S_0$) due to noise and other transient signals. Thus a lower limit NT' is established as a number of counts below which limit the touch pad output must fall prior to a valid touch condition (at magnitude T) being established. The difference W between the expected no-touch magnitude NT and the lower no-touch limit magnitude (i.e. NT-NT') is the "window"; this "window" is a preselected fixed-offset count preloaded from circuit 18 into counter 17 to bias the count in a direction opposite that of a touch output to assure that transients and other undesired signals do not cause a lower, touch count (T) when the associated touch pad has actually not been activated.

In a similar manner, the output of a touch-detect signal during intervals $t_2$, $t_3$ or $t_4$ will indicate that touch pads TP2, TP3 or TP4, respectively, have been touched, as shown in FIG. 3h.

During the last part of any cycle associated with any particular touch pad, the contents of the up/down counter 20, which is the no-touch value of the particular touch pad, is rewritten into the memory 19, as indicated in FIG. 3g.

This process then continues sequentially to constantly monitor whether or not a touch has been registered on any of the touch pads TP1 to TP4 as well as any other additional touch pads which might be added to the system.

In accordance with an important feature of the invention, the system of FIG. 1 is systematically operated in an optimization mode after some given number of measurement modes of operation. During the system optimization mode, the memory 19 will be updated with the latest values of the no-touch condition for the touch pads TP1 to TP4.

When the optimization mode is entered, the control logic circuit 15 produces an output signal on the "optimize" line 15b and the operation of the circuit is identical to its normal operation with two exceptions. The first is that during the reset period, the counter 17 is not preset to a "window" value (as the output of gate 26 does not activate counter input 17c), but instead the counter is cleared to a zero value. That is, no offset is applied to counter 17. This is because the two inputs of gate 27 are both high with the optimize and reset signal, thereby activating the clear input 17d of counter 17. Secondly, when the conversion is completed by converter 16, a comparison is made between the contents of the up/down counter 20 (which is the past no-touch value) and the contents of the CTAD counter 17 which is the present no-touch value.

If the two counts are equal, then no action is taken. However, if the present measured value is greater than the past value, then an output signal is applied to line 23 to trip gate 24 and apply an input signal to the up input of counter 20 to bump counter 20 up by one count. This revised value is thereafter routed to the data input 19c of memory 19 and is then rewritten into memory 19 responsive to a WRITE signal from control logic 15 to memory 19. Similarly, if the present no-touch count is lower than the count in counter 20, then line 22 is activated to trip gate 25, 25, thereby applying an input signal to the down terminal of counter 20 bumping the counter down by one count. Again, this altered value is rewritten into memory 19 at the end of the optimized cycle.

By permitting a change of only one count in the up/down counter 20 in any given cycle, the circuit accommodates the conditions where a large voltage transient may have occurred during optimization or the optimization mode was entered simultaneously with a user touch condition occurring on the particular pad. This condition will then be corrected during the next optimization mode.

From the above, it will be seen that the novel arrangement of FIG. 1 permits the multiplexing of a large number of touch pads while requiring relatively few connections to the touch pad system and accommodating wide variations in the touch pad circuits. The novel circuit also permits the continuous updating of the no-touch condition for each of the touch pads, which updating is not significantly changed by short-term transients so that the circuit is self-optimizing.

Figure 2:
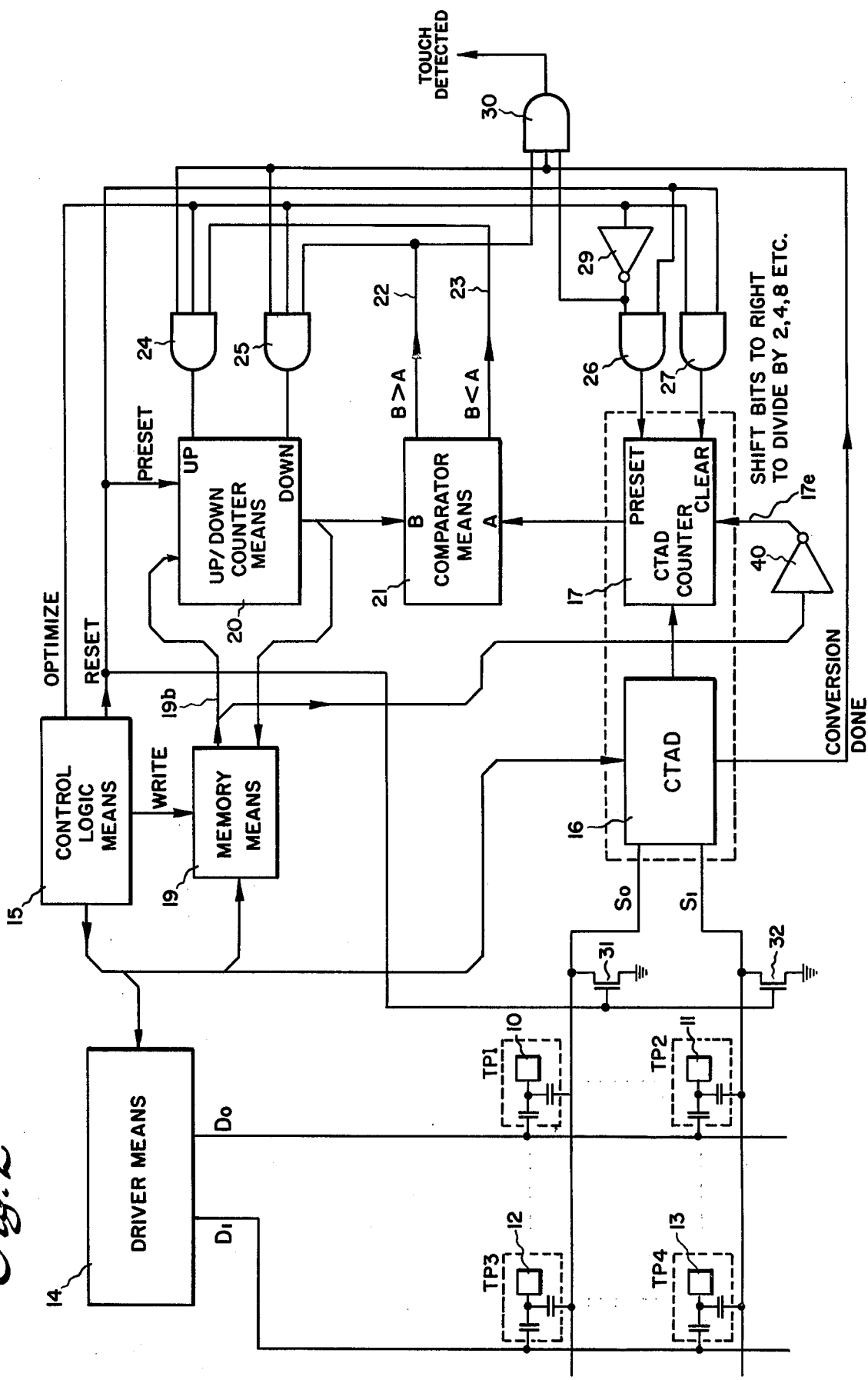
FIG. 2 is a block diagram of a second embodiment of the invention wherein the touch condition is recognized when the digital output of any of the touch pads is a fixed percentage of the no-touch value below the no-touch value stored in the memory.

FIG. 2 shows a second embodiment of the invention wherein the CTAD counter 17 is preset with a fixed percentage of the no-touch value of any one of the touch pads TP1 through TP4. Thus, the circuit differs from FIG. 1 essentially in that the A/D counter 17 in FIG. 1 was preset with a fixed percentage value. The circuit of FIG. 2 and its operation are otherwise identical to that of FIG. 1 and similar components have been given similar identifying numerals.

In FIG. 2 an inverter 40 has been added which brings a signal from memory output 19b to a shift input 17e of the counter 17. This will enable the shift of bits in the counter 17 to the right in order to divide by two, four, eight or the like, thereby to preset the desired percentage of the no-touch value which is to be read out of the counter 17 during the comparison operation. Thus, to apply a fixed "window" of $(100/2^N)\%$, the previously stored no-touch value is applied to counter 17 and is shifted N times to the right, in the counter; an N-right shift is equivalent to a division by $2^N$. Illustratively, if N=2, the stored value is shifted right twice, whereby $100/2^N\%$ or (25%) of the no-touch value is preset into counter 17; a touch condition now occurs only if the touch pad output value is below 75% (i.e. $100 - 100/2^N)\%$ of the no-touch value.

Although a preferred embodiment of this invention has been described, many variations and modifications will now be apparent to those skilled in the art, and it is therefore preferred that the instant invention be limited not by the specific disclosure herein but only by the appended claims.

We claim:

1. A touch pad sensor circuit comprising, in combination:
   a plurality of drive lines;
   a plurality of sense lines;
   a plurality of capacitive touch pads, each having an input coupled to one of said drive lines and an output coupled to one of said sense lines, each touch pad being coupled between a different combination of drive and sense lines from any other touch pad;
   driver circuit means for providing a drive signal to a selected one of said plurality of drive lines;
   an A/D converter circuit;
   means for selectively coupling each one of said plurality of sense lines to said A/D converter circuit;
   control logic means coupled to said driver circuit means for determining the sequence in which each of said drive lines is selected to receive said drive signal in sequential manner; said control logic means also for causing said coupling means to couple sequential ones of said sense lines to said A/D converter circuit;
   a counter connected to said A/D converter circuit for producing a count of the digital output thereof;
   memory means coupled to said control logic means for storing a digital value representative of the magnitude of an output signal of each of said touch pads in a no-touch condition without contact thereof by an outside influence with said touch pad;
   up/down counter means for receiving the no-touch digital value stored in said memory means for the one touch pad then coupled between a drive line having said driving signal thereon and said A/D converter circuit; and
   comparator circuit means for comparing the digital output count of said counter and the no-touch digital value in said up/down counter means to produce an output signal when the count of the A/D converter circuit differs from the count in said up/down counter means by more than a preselected amount.

2. The touch pad sensor circuit of claim 1, further including means for detecting a change in the no-touch digital value of the output of the one touch pad then coupled between a drive line having a drive signal thereon and said A/D converter circuit; and means connected to said memory means for changing the no-touch digital value stored therein for said one touch pad, then coupled between the driven drive line and said A/D converter circuit, to a new no-touch digital value higher or lower than the no-touch digital value previously stored in said memory means for that touch pad.

3. The touch pad sensor circuit of claim 2, wherein said control logic means provides an optimize signal; said comparator means provides a different one of a pair of output signals if the output of said one touch pad then coupling said driven drive line to said A/D converter circuit is respectively higher or lower than the no-touch digital value stored in said memory means for that particular sensor; and further including means for changing the count in said up/down counter means responsive to one of said comparator means output signals being generated.

4. The touch pad sensor circuit of claim 3, wherein the count in said up/down counter means is changed by a maximum of one count for each optimize signal provided by said control logic means.

5. The touch pad sensor circuit of claim 1 wherein said A/D converter circuit is a CTAD converter.

6. The touch pad sensor circuit of claim 1 further including means for preloading an offset count into said counter to establish a detection window.

7. The touch pad sensor circuit of claim 1, further including means for loading the no-touch digital value, for the driven touch pad then coupled to said A/D converter circuit, from said memory means into said counter and for subsequently shifting the count in said counter by N places, where N is an integer, to establish an offset equal to $(100/2^N)\%$ of the no-touch digital value previously stored in said memory means for the driven touch pad then being coupled to said A/D converter circuit.

8. A touch pad sensor comprising, in combination:

at least one capacitive touch pad;

driver circuit means for providing a drive signal to said capacitive touch pad;

An A/D converter circuit coupled to said driver circuit means through said capacitive touch pad;

a first counter connected to said A/D circuit for producing a digital count representative of an output of said touch pad in one of touch and no-touch conditions;

memory means for storing a last previous no-touch digital count representative of a last previous output of said touch pad;

an up/down counter receiving said last previous no-touch digital count from said memory means;

comparator means for comparing the counts in said first counter and in said up/down counter;

circuit means connected between said comparator means and said up/down counter for increasing or decreasing the count in said up/down counter when said up/down counter contains a digital count received from said memory means which digital count is lower or higher respectively than the count in said first counter; and means for reading the last count in said up/down counter back into said memory means.

9. The touch pad sensor of claim 8, wherein the count in said up/down counter is changed by a maximum of one count in any given comparison between the counts in said up/down counter.

* * * * *